(12) United States Patent
Plettner

(10) Patent No.: US 7,402,460 B1
(45) Date of Patent: Jul. 22, 2008

(54) METHOD FOR PRODUCTION OF CONTACTLESS CHIP CARDS AND FOR PRODUCTION OF ELECTRICAL UNITS COMPRISING CHIPS WITH CONTACT ELEMENTS

(76) Inventor: Andreas Plettner, Lennestrasse 5, 82340 Feldafing (DE)

( * ) Notice: Subject to any disclaimer, the term of this patent is extended or adjusted under 35 U.S.C. 154(b) by 560 days.

(21) Appl. No.: 10/110,147

(22) PCT Filed: Oct. 6, 2000

(86) PCT No.: PCT/EP00/09818

§ 371 (c)(1),
(2), (4) Date: Aug. 7, 2002

(87) PCT Pub. No.: WO01/27871

PCT Pub. Date: Apr. 19, 2001

(30) Foreign Application Priority Data

Oct. 8, 1999 (DE) .................................. 199 48 555

(51) Int. Cl.
*H01L 21/50* (2006.01)
*H01L 21/48* (2006.01)
*H01L 21/44* (2006.01)

(52) U.S. Cl. .................. 438/108; 438/113; 438/118; 438/462; 438/464

(58) Field of Classification Search ................ 438/108, 438/113, 118, 462, 464
See application file for complete search history.

(56) References Cited

U.S. PATENT DOCUMENTS

| | | | | |
|---|---|---|---|---|
| 4,551,912 A | * | 11/1985 | Marks et al. .................. 29/827 |
| 4,756,080 A | * | 7/1988 | Thorp et al. .................. 29/827 |
| 4,949,148 A | * | 8/1990 | Bartelink ..................... 257/785 |
| 5,139,192 A | * | 8/1992 | Simmonds ............... 228/179.1 |
| 5,731,244 A | * | 3/1998 | Evers .......................... 438/617 |
| 6,165,814 A | * | 12/2000 | Wark et al. .................. 438/108 |
| 6,185,815 B1 | * | 2/2001 | Schindler ..................... 29/740 |
| 6,566,163 B1 | * | 5/2003 | Laroche et al. ............. 438/106 |

FOREIGN PATENT DOCUMENTS

| | | |
|---|---|---|
| DE | 44 31 605 A1 | 3/1996 |
| DE | 196 16 424 A1 | 10/1997 |
| DE | 196 51 566 A1 | 6/1998 |
| DE | 197 16 342 A1 | 10/1998 |
| EP | 0662708 A1 * | 7/1995 |
| EP | 0 928 016 A1 | 7/1999 |
| FR | 2 761 527 | 10/1998 |
| WO | WO 98/43205 | 10/1998 |
| WO | WO 98/52224 | 11/1998 |

* cited by examiner

*Primary Examiner*—Zandra Smith
*Assistant Examiner*—Khanh B Duong
(74) *Attorney, Agent, or Firm*—Seed IP Law Group PLLC

(57) ABSTRACT

Method of producing electrical units consisting of chips with contact elements, wherein the contact elements are suited for the direct connection with contact terminals of external electric components in an electrically conductive manner, wherein the connection of the contact elements with the chips is effected before the individual chips are removed from the grouping predefined by the wafer and consisting of rows and columns, and the contact elements are made of a metallized plastic foil or metallic foil to be applied onto the chips.

50 Claims, 10 Drawing Sheets

(a)

(b)

(c)

(d)

(a)

(b)

(c)

METHOD FOR PRODUCTION OF CONTACTLESS CHIP CARDS AND FOR PRODUCTION OF ELECTRICAL UNITS COMPRISING CHIPS WITH CONTACT ELEMENTS

CROSS REFERENCE TO RELATED APPLICATIONS

This is the U.S. national stage of PCT application PCT/EP00/09818 which has an international filing date of Oct. 6, 2000 and which claims priority from German application Serial No. 199 48 555.0 filed Oct. 8, 1999.

TECHNICAL FIELD

The present invention relates to a method of producing electrical units consisting of chips with contact elements according to the preamble of patent claim 1, as well as to a method of producing carrier substrates for receiving the electrical units according to the preamble of patent claim 21, as well as to a method of producing contactless chip cards according to the preamble of patent claim 24.

BACKGROUND OF THE INVENTION

Contactless chip cards increasingly replace chip cards provided with contacts. The reason therefor is particularly due to the fact that contactless chip cards allow an easier handling, have a more robust construction and are, thus, less susceptible to failure, and they offer a number of interesting new possibilities as far as their use is concerned, as they do not have to be inserted into a reading device.

It is generally known that contactless chip cards comprise a loop conductor or antenna provided in the chip card, by means of which the chip likewise provided in the chip card can communicate with the world outside. For this purpose, the loop conductor has to be connected during the production of the contactless chip card with the contacts of the chip or, respectively, the corresponding module. For achieving this electrical connection between the loop conductor and the chip, a plurality of methods have already been proposed, whereby particularly the following methods were successful.

FIG. 10 illustrates the principle as to how, according to the prior art, an electrical connection between a chip module 1 and a loop conductor 4 is typically produced.

A chip module 1, in the interior of which a non-illustrated chip is provided, comprises externally accessible contacts 2 which are connected with the actual contacts of the chip, for example, by means of a soldering, gluing or wire bonding process. Reference number 3 designates contact terminals producing, by means of an electrical conductor 5, an electrical connection to the loop conductor 4 disposed on a chip card body 6. In order to eventually obtain a contact between the loop conductor 4 and the chip, the contacts 2 have to be connected with the contact terminals 3 in an electrically conductive fashion. For this purpose, module 1 is placed onto the contact terminals 3 by means of a tool, namely with the side provided with the contacts.

Another possibility resides in placing the chip 15 as such, i.e. not in the form of a module, but "naked", onto the contact terminals 3, which is illustrated in FIG. 10a. By using this modification, the chip 15 has to be placed onto the contact terminals 3 with its "active side", i.e. the side bearing the bond pads 13. For this purpose, the chip must be "flipped", which requires the gripping of the chip 15 from the wafer or carrier substrate twice.

FIG. 11 illustrates another possibility, namely as to how, according to the prior art, an electrical connection between a chip 15 and a loop conductor 4 can be produced by means of a wire bonding process.

In order to achieve, in this case, a contact between the loop conductor 4 and the chip 15, the chip is applied onto the chip card body 6, and the bond pads 13 are connected with the contact terminals 3 by means of wire bonds in an electrically conductive fashion. It can be seen that, in accordance with this solution, the chip 15 no longer has to be flipped. However, the wire joints 34 produced by the wire bonding require a larger overall construction height of the chip card and, moreover, have to be protected by a solid protection layer.

Another type of contact is known from German patent DE 196 09 636 C1. According to the solution described therein, a chip module is brought into a recess of the chip card body such that the contacts provided on the surface of the module have even ends with path conductors on the body surface, so that a contact between the loop conductor and the contacts of the module can be achieved. A drawback in this embodiment resides in that the depth of the recess must be dimensioned with extreme exactness to as to allow the plane ending of both contacts.

SUMMARY OF THE INVENTION

On the basis of the prior art it is the object of the present invention to provide a possibility of producing contacts between a chip and the antenna of a contactless chip card in a simple and particularly fast manner, whereby said contacts are to be extremely electrically and mechanically reliable.

Said object is provided by the subject matters of patent claims 1, 21 and 24. Preferred embodiments of the invention are subject matters of the subclaims.

The object of the present invention is especially provided by a method of producing electrical units consisting of chips with contact elements, wherein the contact elements are suited for the direct connection with contact terminals of external electric components in an electrically conductive manner, wherein the connection of the contact elements with the chips is produced before the individual chips are removed from the grouping defined by the wafer and formed of rows and columns, and wherein the contact elements are made of a metallized plastic foil or, respectively, metallic foil to be provided on the chips.

Furthermore, the object of the present invention is provided by a method according to the subject matter of claim 21 and by a method according to claim 24.

Preferred embodiments of the present invention are subject matters of the subclaims.

In accordance with a special aspect of the present invention, chip contact element units are produced on a wafer level, whereby said units serve to provide an electrical connection between the "naked" chip and a loop conductor or antenna disposed in a chip card body. The contact elements are thereby preferably terminal lugs, which are directly connected with the bond pads of the chip on a wafer level. The contact elements preferably provided as terminal lugs have dimensions allowing a contact with the contact terminals of loop conductors or antennas without involving any problems, wherein the overall construction height of the chip card is at most unessentially increased due to the evenly projecting terminal lugs. The length of said contact elements may be so dimensioned that the contact elements permit a connection of the chip with contact terminals disposed at the opposite side of the bond pads of the chip, whereby the turning by means of a flip chip process described above in connection with the prior art is avoided. The actual contacting with the antenna can be effected extremely easily and fast.

Apart from the above-described advantages the present method especially has the advantage that an efficient production of chip contact element units already on a wafer level is achieved, so that a laborious individual bonding of each individual chip is no longer necessary. Thus, it is possible to contact whole rows of chips on a wafer at the same time, and in the case where the individual rows of the waver are arranged to have the correct distance to one another in advance, even a simultaneous bonding of all bond pads of the chip with a foil placed over the chips of the wafer can be achieved. During the production of said chip contact element units the chips remain grouped to each other, whereby said grouping essentially corresponds to the grouping defined by the wafer production, and whereby, of course, a broadening of the distances between the individual chips should be obtained with suitable means. The spreading of the individual chip rows or, respectively, chip columns may thereby be effected by suitable precise mechanical apparatus, whereby an adhesive foil is preferably used for ensuring the correct alignment.

As was mentioned above, the bond pads of the chips may be contacted simultaneously at least row by row or column by column, namely if contact foils are used which cover the width of the entire wafer. Alternatively, also substrates may be used as foils, which are unrolled over the rows or columns of chips.

The eventually produced chip contact element unit is extremely robust, as the contact elements are resistant to tensile loads due to their dimensions and the bond pads preferably having a corresponding size, with the result that it may no longer be required to glue the chips onto the chip card body, whereby the process times are reduced because of the avoidance of the retention time required for gluing. Thus, the chip is not connected with the chip card body, which results in an efficient strain relief of the chip, as the chip card body may be extended or bent without stressing the chip itself. In the case where the chip is to be protected with a cover mass, the strain relief may be achieved by the cover mass being more easily extensible than the chip card body. Moreover, the protection of the chip may also be obtained by means of a cover foil laminated onto the chip and the chip card body, whereby a sticky or adhesive connection of the cover foil with the chip or the contact elements has to be avoided so as to maintain the aforementioned strain relief.

If it is desired to connect the chip with the chip card body, e.g. by means of gluing, the aforementioned strain relief of the chip may be obtained by selecting the bonding glue used between the chip and the chip card body such that the chip is more extensible or, respectively, softer than the chip card body. Moreover, the chip card body as such may be more extensible in the vicinity of the chip to thereby effect the relief strain of the chip. Another possibility for relieving the strain of the chip resides in arranging target bending points around the chip area, which can either be obtained by a perforation of the chip card body or by applying another extensible material or by thinning the chip card body at the corresponding points. If the chip card body is extended or bent, the extending or bending is effected at the provided target bending points so that the chip is again strain-relieved. Said effect may also be achieved by reinforcing the chip area or, respectively, the chip vicinity instead of weakening the chip card body about said chip area, with the result that the chip area is less extensible than its vicinity.

It should be mentioned that different methods of the above-described methods may be combined with each other for achieving a strain relief of the chip, so as to make the desired effect even stronger. If, for instance, the chip is not glued to the chip card body, a reinforcement of the chip area and a perforation of the vicinity of the chip area may additionally be provided.

In all above-described cases, and independently thereof, also a strain relief of the contact elements may be effected in addition to the strain relief of the chip. In this case the contact elements are so constructed that their length is larger than the distance between the bond pads of the chip and the contact terminals of the loop conductor or the antenna. Thus, the contact elements are not tensioned to be taut during the bonding, but are arranged between the chip and the contact terminals in an undulated way. By said undulation of the contact elements a strain relief of the contact elements may be obtained.

With suitable means the chip contact element units may especially be applied onto the carrier substrates row-wise or column-wise, whereby, by means of corresponding process steps, also the production of "endless substrates" is feasible. An advantageous modification resides in applying the chip contact element units onto the carrier substrates such that the contact elements project to both sides of the carrier substrate in an orthogonal fashion. This results in an extremely easy handling when the chip is brought into the card body. According to another modification the contact elements of a row or column are not separated from each other, thereby forming a self-carrying substrate structure. A carrier substrate is not required according to this modification.

The actual shape of the contact elements is preferably obtained by cutting them out of the applied contact foil, whereby the cutting is preferably done by means of a laser. As an alternative the applied foil may already be pre-structured, so that extensive cutting steps are not necessary.

Preferred embodiments of the present invention will hereinafter be explained in more detail with reference to the attached drawings, wherein

DETAILED DESCRIPTION OF THE PREFERRED EMBODIMENTS AND BEST MODE FOR CARRYING OUT THE INVENTION

Figure 1:
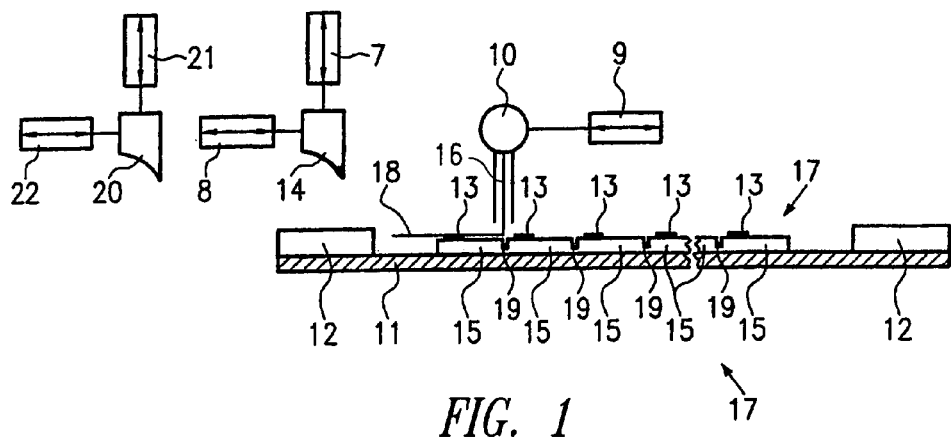
FIG. 1 is a schematic lateral view of a device for producing electrical units formed of chips with contact elements.

FIG. 1 shows a schematic lateral view of a device for unrolling a foil 16 over a wafer 17, as well as a cross-sectional view of a connecting means 14 and a cross-sectional view of a separating means 20.

The wafer 17 comprises a plurality of chips 15 separated from each other by a plurality of saw lines 19, and is accommodated by a holding frame 12 comprising a saw foil 11. For individualizing said chips 15 the wa fer is sawn along the different saw lines 19. Instead of completely sawing the wafer 17 along the saw lines 19, a notching may be effected, i.e. the saw lines 19 are not "sawn through" down to the saw foil 11, which is broken at a later time.

A metallized plastic foil or, respectively, a metallic foil 16 is preferably unrolled over the wafer 17 with an unrolling means 10. According to a particularly preferred embodiment a gold foil or a plastic foil laminated or vaporized with gold is used. Moreover, the gold metallization on the plastic foil may be structured so as to largely predefine the shape of the contact elements 18 and to largely avoid subsequent cutting steps. By means of a drive 9 the foil 16 can thereby be moved back and forth horizontally in the direction of the double arrow on a roll.

Foil 16 is now connected with he bond pads 13 of the individual chips 15 by a connecting means 14, which may be effected by soldering, bonding or gluing, preferably while the foil 16 is unrolled over the wafer 17. Alternative embodiments permit the connection of the foil 16 with the bond pads 13, for instance, also when the unrolling of the foil 16 over the entire wafer 17 is terminated. The connecting means 14 can be moved back and forth horizontally by means of a drive 8, or vertically by means of a drive 7.

Finally the foil 16 is separated into the individual contact elements 18 by a separating means 20, e.g. by means of a laser. The separating means 20 can be moved back and forth horizontally by a drive 22, or vertically by a drive 21. Other embodiments provide, for instance, the connection of the foil 16 with the bond pads 13 and the subsequent separation into the individual contact elements 18 by a single device. By separating the foil 16 into the individual contact elements 18 chip contact element units are formed, which are thereafter prepared for the further processing thereof by different possibilities. The units thus formed on a wafer level, each consisting of a chip 15 with connected contact elements 18, such as terminal lugs, have the advantage, apart from an easy and particularly fast kind of production, that the chip does not have to be turned, i.e. "flipped", anymore when it is inserted into the chip card later, as the contact elements 18 permit a connection between the bond pads 13 of the non-turned chip 15 lying on top and the contact terminals 3 of a loop conductor or antenna 23 lying underneath, which is described in connection with FIG. 9a.

The individual steps required for forming the chip contact element units are described on the basis of FIGS. 2 to 6a.

Figure 2:
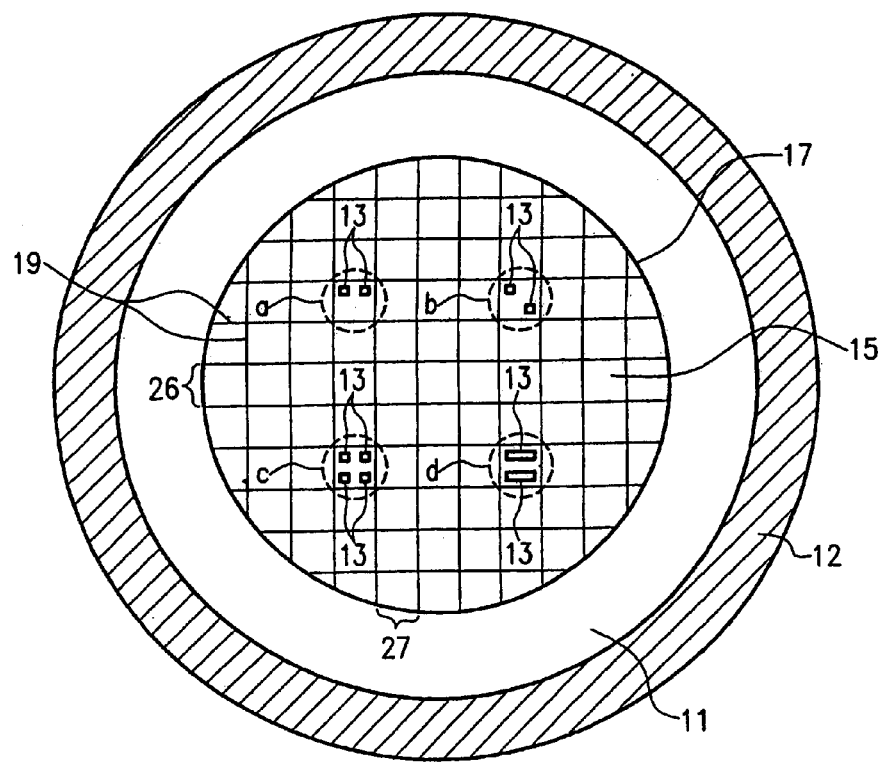
FIG. 2 is a schematic view of a wafer in a holding frame with exemplary embodiments of the chips to be used.
Figure 10:
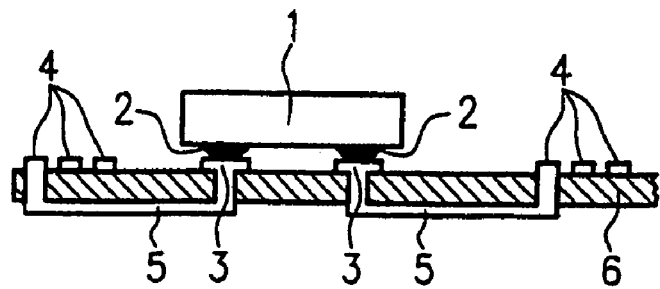
FIGS. 10 and 10a are schematic illustrations of a module or chip contacting according to the prior art.
Figure 10A:
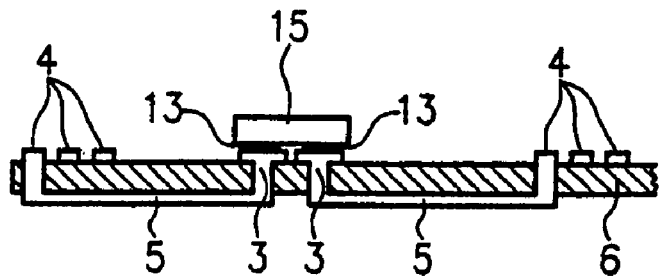
Figure 11:
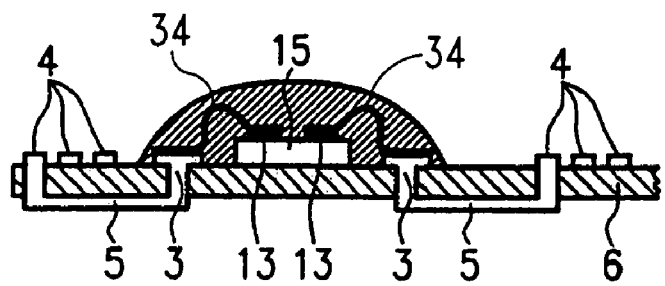
FIG. 11 is a schematic illustration of a chip contacting according to the prior art by means of a wire bonding process.

In FIG. 2 the wafer 17 of FIG. 1 is shown in a top view. The wafer 17 comprises a plurality of chips 15 arranged in rows 26 and columns 27 separated from each other by a plurality of saw lines 19 and each having two or more bond pads 13. Via said bond pads 13 an electrical connection of each individual chip 15 with contact terminals 3 of external electric components 4 (compare FIG. 10) can be produced later. As is exemplarily illustrated in FIG. 2, different possibilities a-d for arranging the bond pads 13 on the chips 15 are possible.

Arrangement possibility b) shows two bond pads 13 arranged on the surface of the chip 15 diagonally to each other. In a) both bond pads 13 are parallel to each other at the same distance to one side of the chip 15, in c) four bond pads 13 are each illustrated in the corners of chip 15, and in d) two broad bond pads 13 are each shown parallel to two opposite sides of the chip 15.

For individualizing chip 15 the wafer 17 is sawn. For maintaining the grouping of the individual chips 15 in the wafer form also after the sawing, the wafer 17 is, prior to the sawing, preferably applied onto an adhesive saw foil 11, by which the illustrated arrangement of the chips 15 in their original distances is secured also after the sawing. The saw foil 11 could hereby also be replaced by another substrate (not illustrated). The holding frame 12 additionally supports the coherence of the chip grouping in the wafer form, as it prevents an unintended extension of the saw foil 11.

Figure 3:
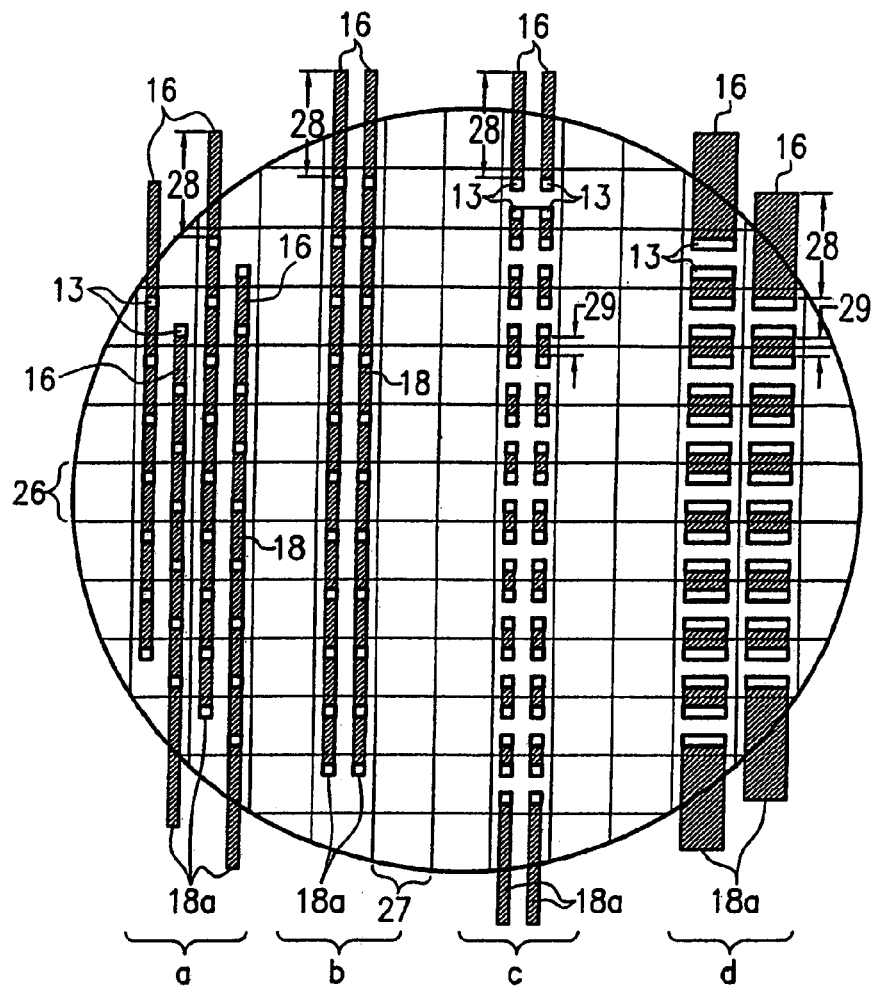
FIGS. 3 and 4 are schematic views of a wafer with four exemplarily indicated possibilities for providing contact elements.

As is schematically shown in FIG. 3, contact elements 18 are thereafter connected with the bond pads 13 of the chips 15 grouped in a wafer form by applying a foil 16 unrolled over the wafer 17, wherein the different indicated modifications a)-d) are dependent on the different possibilities of arranging the bond pads 13 on the chips 15, according to FIG. 2, a-d.

Independently of the possibility of arrangement according to FIG. 2, a-d, all bond pads 13 lying parallel to the same vertical saw line 19, i.e. they form a vertical row of bond pads, are hereinafter designated as vertical contact rows with reference number 18a, while reference number 18b is used for designating horizontal contact rows.

The following description refers, at first, to the application of contact elements 18 to bond pads 13 of chips 15 according to the arrangement possibilities a) and b).

At first, a foil 16, whereof the width approximately corresponds to the width of a vertical contact row 18a (approximately 50 to 200 µm), is unrolled in front of a first bond pad 13 of contact row 18a by an intended length 28 of the contact element 18. The contact between foil 16 and bond pad 13 is produced directly. Thereupon, the foil 16 is unrolled horizontally over the vertical contact row 18a by the intended length 28 of the contact element 18. If the bond pad 13 of the next row 26 should thereby be exceeded, the unrolling means 10 has to be moved back to said bond pad 13 by means of the drive 9 (compare FIG. 1). Thereafter, the foil 16 is connected with the second bond pad 13.

Figure 3A:
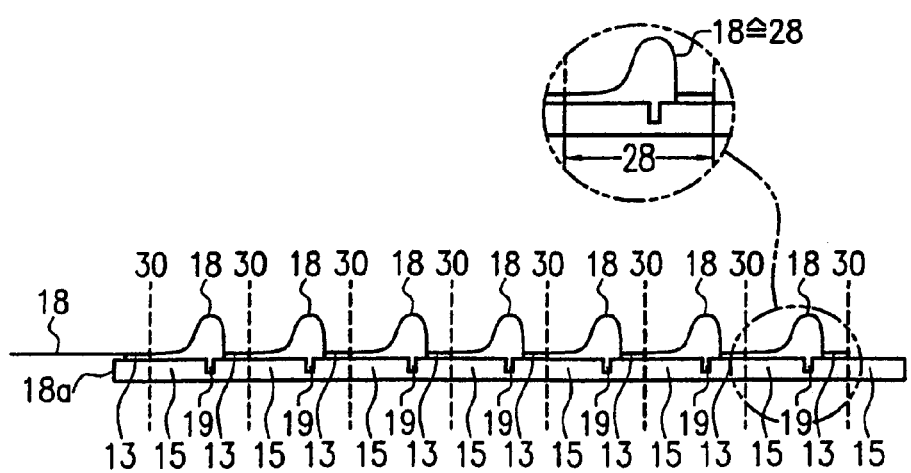
FIGS. 3a and 3b are schematic lateral views of wafer columns with exemplarily provided contact elements.

This procedure is repeated until each bond pad 13 of the first vertical contact row 18a is connected with the foil 16. This results in a sectional drawing corresponding to FIG. 3a, wherein the undulation of the contact elements 18 may be formed by a possible return movement of the unrolling means 10.

Figure 3B:
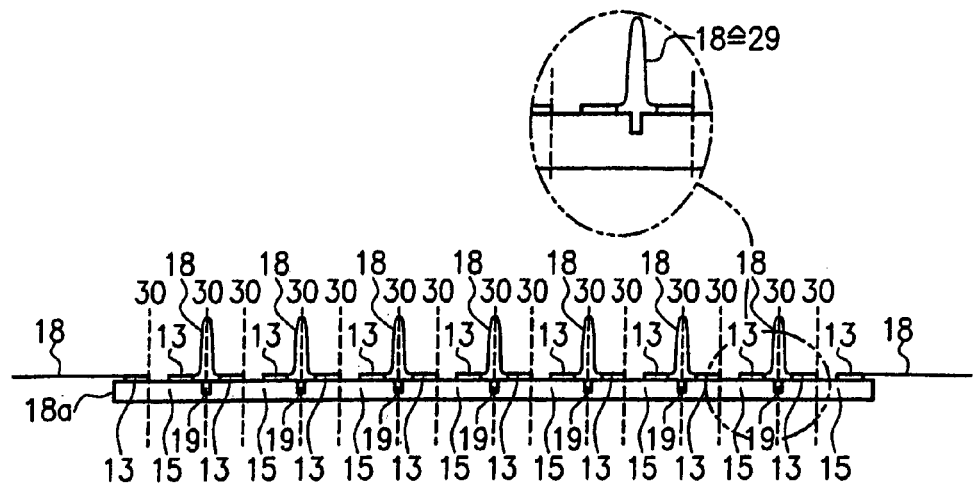

The foil 16 can now be separated behind the individual bond pads 13 of the respective chips 15 at points 30 by a separating means 20 (compare FIG. 1), whereby chip contact element units are obtained, the contact elements 18 of which have the intended length 28. While according to the arrangement possibilities a) and b) the foil 16 is unrolled only by the intended length 28, it has to be unrolled, according to arrangement possibilities c) and d), between the bond pads of adjacent chips 15 by double the intended length 29. This results in the sectional drawing illustrated in FIG. 3b. The foil 16 is no longer separated behind the individual bond pads 13 of the individual chips 15, but exactly above the individual saw lines 19, so as to obtain contact elements 18 with the respectively intended length 28.

Prior to describing the separation of the foil 16 into the individual contact elements 18 and the individualization of the chips 15 on the wafer 17, other embodiments for the connection of different foils 16 with the bond pads 13 of the individual chips 15 on the wafer 17 are now to be described.

Figure 4:
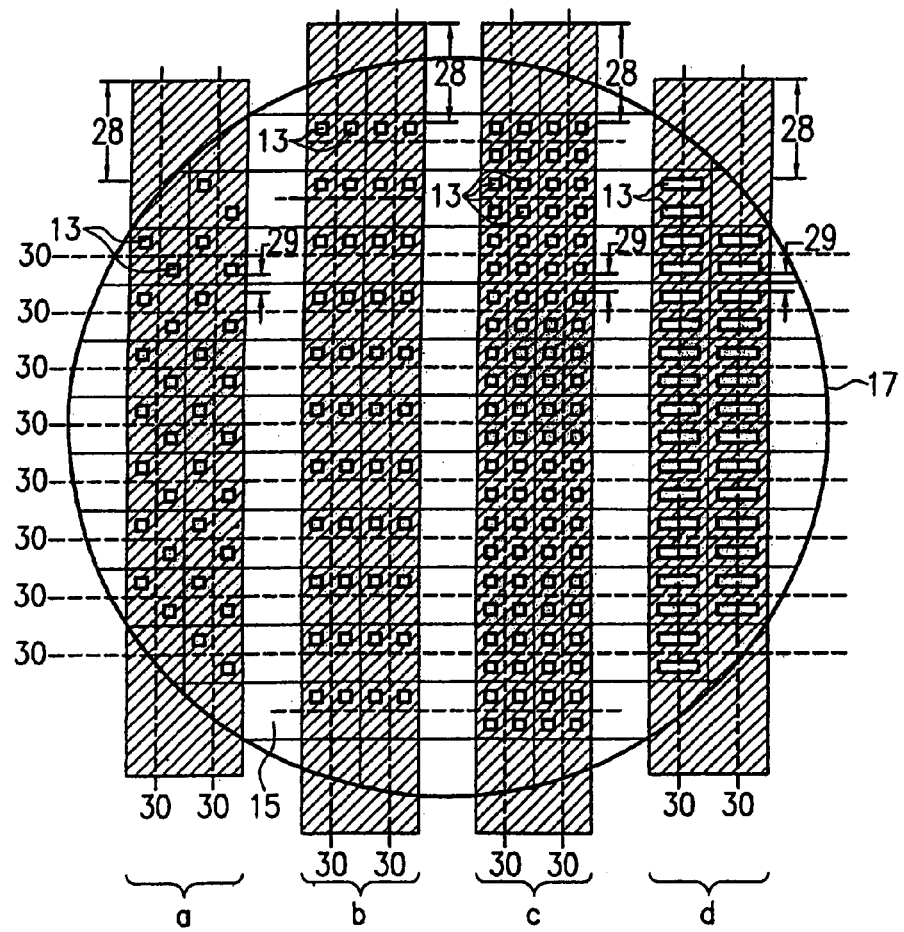

FIG. 4 is a modification of FIG. 3 differing in that the width of the foil 16, which is unrolled over vertical contact rows 18a, corresponds to the width of at least two vertical contact rows 18a. The width of foil 16 can, thus, vary between the width of a chip 15 and the width of the entire wafer 17. This difference requires that the foil 16 be unrolled by double the intended length 29 between the bond pads of adjacent chips 15 in the case of modifications a), c) and d), and that the foil 16 be unrolled by a single intended length 28 between the bond pads of adjacent chips 15 in the case of modification b). Thus, in response to the respective arrangement a)-d) of the bond pads 13 on the chips 15, different sectional drawings are obtained, wherein a sectional drawing according to FIG. 3a results for arrangement possibility b), and a sectional drawing according to FIG. 3b results for arrangement possibilities a), c) and d).

Apart therefrom the way of operation according to FIG. 4 corresponds to the one according to FIG. 3, whereby the electrical connections between the individual bond pads 13 of each chip 15 have to be separated due to the width of the foil 16, before the foil 16 is separated into individual contact elements 18. For this purpose, an additional separation process is required, precedes the separation of the foil 16 into the individual contact elements 18 and the subsequent individualization of the chips 15, whereby the foil 16 is separated along separation lines 30.

Methods were introduced in FIGS. 3 and 4, where a foil 16 with a different width is unrolled over a wafer 17 by an unrolling means 10 moved by drive 9 (compare FIG. 1), and where the original wafer form is maintained, i.e. the original distances of the individual chips 15 to each other remain. It was assumed thereby that the intended length 28 of the contact elements 18 is larger than the distance of the chips 15, whereby the undulation shown in FIGS. 3a and 3b was produced when the foil 16 was unrolled. In the case where the distances of the bond pads 13 of adjacent chips 15 already correspond to the intended length 28 of the contact elements 18, a "wavy" unrolling of the foil 16 can be avoided, and even a plane foil 16 can be placed over an entire wafer 17 and can be connected at the corresponding points with the bond pads 13 of the individual chips 15.

Another possibility will be described in the following, namely as to how the application of the foil 16 can be effected if the distances between the chips 15 are too small in relation to the intended length 28 of the contact elements 18. As can be inferred from the following explanations, a "spreading apart" of rows 26 or columns 27, respectively, takes place in this case, so as to increase the distances to the correct dimension.

Figure 5:
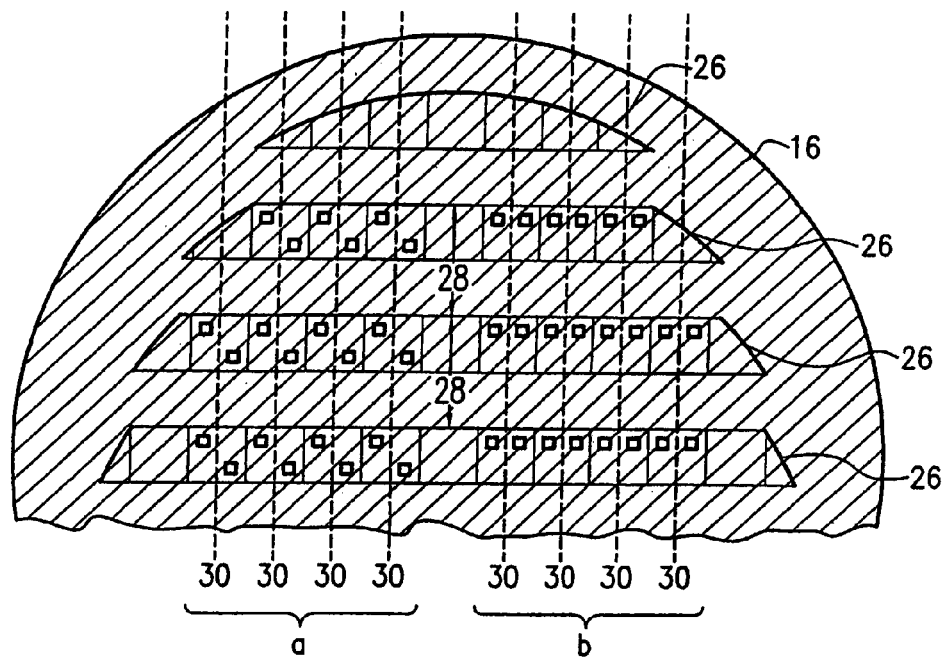
FIGS. 5 and 6 are schematic views of spread apart wafer rows with four exemplarily indicated possibilities for providing a contact element foil.
Figure 5A:
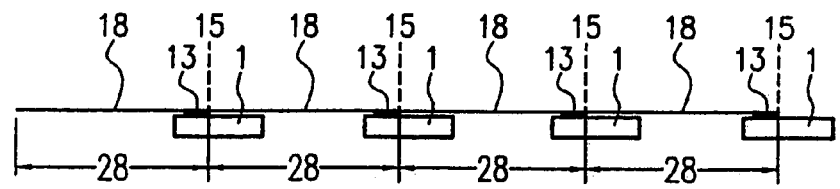
FIGS. 5a and 6a are schematic lateral views of spread apart wafer columns with exemplarily provided contact elements.

As was indicated in FIG. 5, a plane foil 16 can be placed over a "spread apart" wafer 17 and can be connected with the bond pads 13 of the individual chips 15 at the corresponding points. In this procedure, the distance between first horizontal contact rows of respectively adjacent rows 26 covers the intended length 28 of the contact elements 18 after the spreading. Said spreading of rows 26 of the wafer 17 up to the single intended length 28 is possible only in view of arrangements a) and b) of the bond pads 13 of chips 15. If the electrical connection of the bond pads 13 of the individual chips 15 to each other is now separated at corresponding separation lines 30, an arrangement according to FIG. 5a is obtained. The length of the foil 16 between the individual bond pads 13 of the individual chips 15 here corresponds to the intended length 28 of the contact elements 18.

Figure 6:
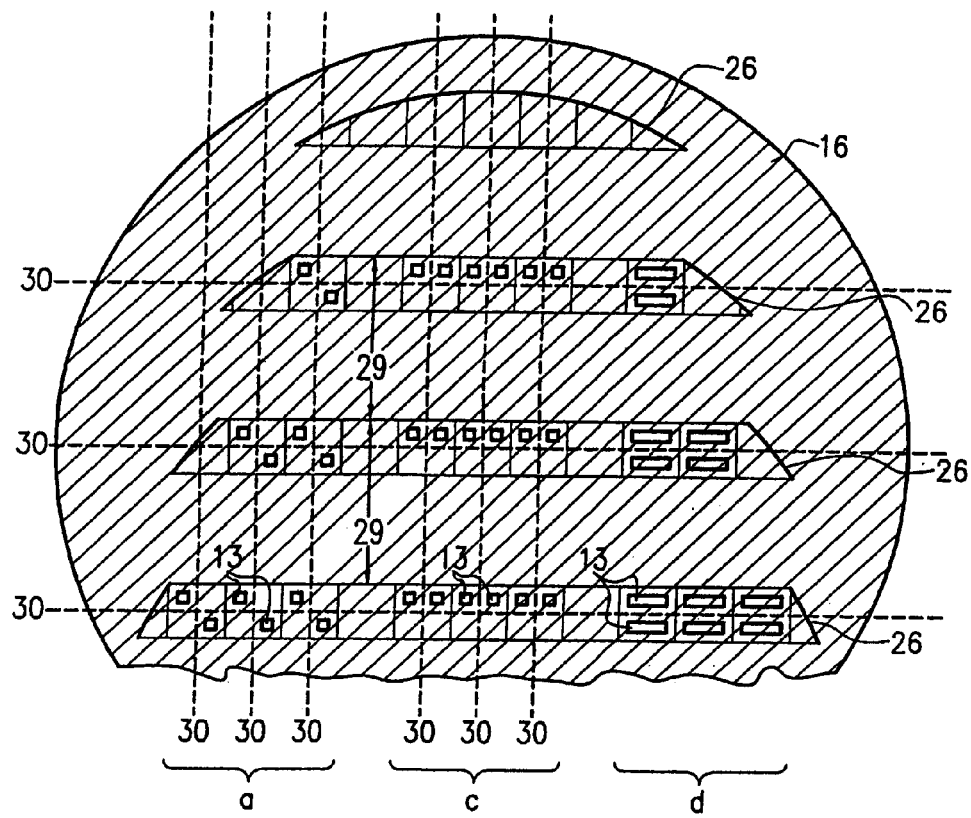

FIG. 6 is a modification of FIG. 5 differing in that the spreading of rows 9 to double the intended length 29 of the contact elements 18 is performed. As to the rest, the way of operation in FIG. 6 corresponds to the one according to FIG. 5.

Figure 6A:
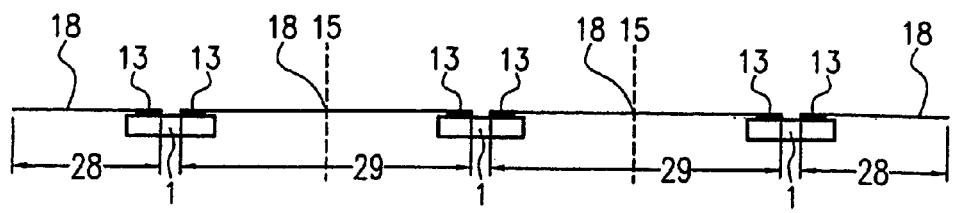

In the special case of arrangement a) of the bond pads 13 of the chips 15, the position of the separation lines 30 for the separation of the electrical connections between the bond pads 13 of the chip 15 and for the separation of foil 16 into the individual contact elements 18 changes. As can be seen in FIG. 6a, the separation of foil 16 into the individual contact elements 18 is performed centrally between two adjacent rows 26 of the wafer 17.

According to FIGS. 5 and 6 the production of the electrical connection between foil 16 and the bond pads 13 of the individual chips 15 may be performed in different ways. Possibilities in this respect relate to pressure, temperature or ultrasound, whereby the individual rows 26 are sequentially passed by a connecting means 10 driven by drive 9 (compare FIG. 1). Several parallel connecting means 10 may also be employed. Moreover, the different methods may be combined with each other, i.e. the spreading of rows 26 of wafer 17 prior to the application of the foil 16, which is described in FIGS. 5 and 6, could also be effected after the connection of foil 16 with the bond pads 13 of the individual chips, which methods are described in FIGS. 3 and 4. Thus, an arrangement according to FIG. 3a would be transferred into an arrangement according to FIG. 5a, or respectively, an arrangement according to FIG. 3b would be transferred into an arrangement according to FIG. 6b.

In dependence on the time of the performance of the process of separating the foil 16 into the individual contact elements 18 chip contact element units are formed, which consist of chips 15 with contact elements 18 and which offer various possibilities for the further processing of exactly said units. These various possibilities will be described in the following.

Figure 7:
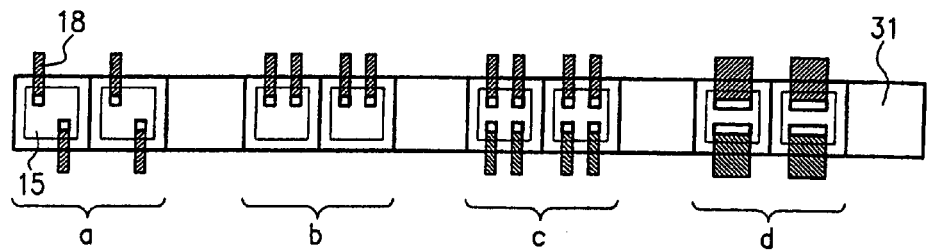
FIG. 7 is a schematic view of a carrier substrate with four exemplarily indicated possibilities for receiving chip contact element units.

FIG. 7 shows a schematic view of a carrier substrate 31 with four exemplarily indicated possibilities a)-d) for receiving chip contact element units, whereby said four possibilities depend on the different possibilities of arranging the bond pads 13 on the chips 15, according to FIG. 2, a-d.

After the foil 16 was separated, preferably by means of a laser, into the individual contact elements 18 along separation lines 30 (compare FIGS. 3a-b, 5a and 6a), the chip contact element units are individually removed from the grouping defined by the wafer 17 (compare FIGS. 3-6) and are sequentially provided to one another on the carrier substrate 31 at predetermined distances (not shown), whereby the individual contact elements 18 project perpendicularly to the chip edges of the individual chips 15 and thus also project perpendicularly from the carrier substrate 31.

Figure 8:
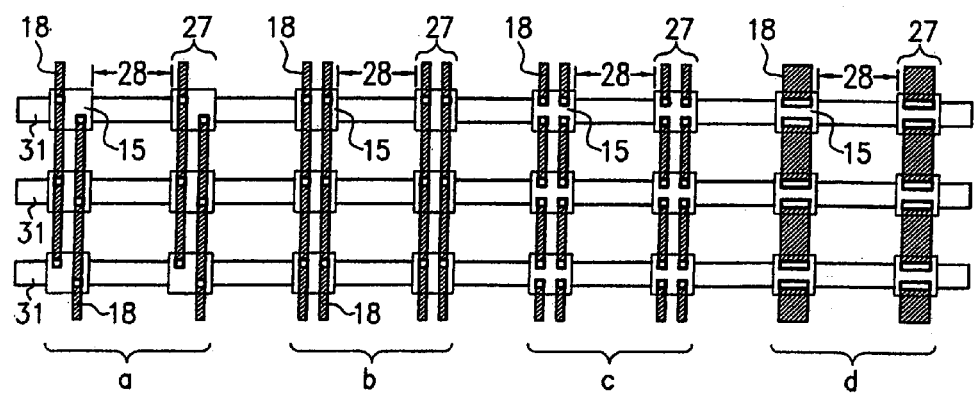
FIG. 8 is a schematic view of spread apart wafer columns on different carrier substrates with four exemplarily indicated possibilities for receiving chip contact element units.

FIG. 8 shows a schematic view of carrier substrates 31 with four exemplarily indicated possibilities a)-d) for receiving chip contact element units, with said four possibilities corresponding to the different possibilities of arranging the bond pads 13 according to FIG. 2. In difference to FIG. 7, columns 27 of the wafer 17 are spread apart, whereby the individual rows 26 are preferably already spread apart. The preferred distance between the individual columns 27 should correspond to an intended length 17 of a contact element 18, it is, however, basically dependent on the respective application and, therefore, not absolutely required.

Underneath the spread apart rows 26 of the spread apart columns 27 carrier substrates 31 may now be applied. The application of said carrier substrates 31 may be effected by means of a glue, which is preferably UV-soluble. The distance of the carrier substrates to each other is defined by the different possibilities a)-d) of arranging the bond pads 13 of the individual chips 15.

Figure 8A:
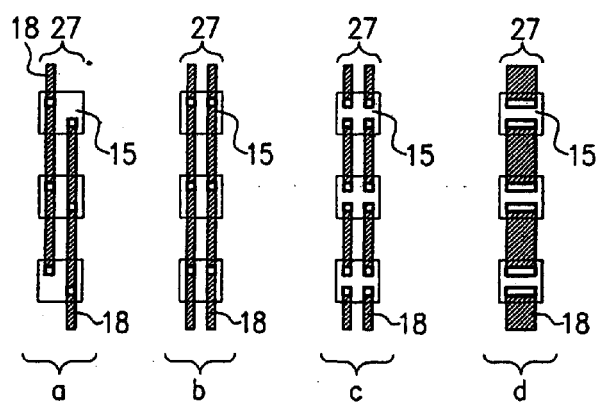
FIG. 8a a is schematic view of wafer columns, whereof the non-separated contact elements adopt the function of carrier substrates.

FIG. 8a shows a schematic view of chip contact element units arranged in a row with four exemplarily indicated possibilities a)-d) for arranging different columns of chip contact element units in a row, whereby said four possibilities correspond to the different possibilities of arranging the bond pads 13 according to FIG. 2 and whereby the non-separated contact elements 18 adopt the function of carrier substrates.

A basic advantage of arranging chip contact element units in a row according to FIG. 8 or 8a, respectively, resides in a favorable transportability and in an easy mechanical handling.

Figure 9:
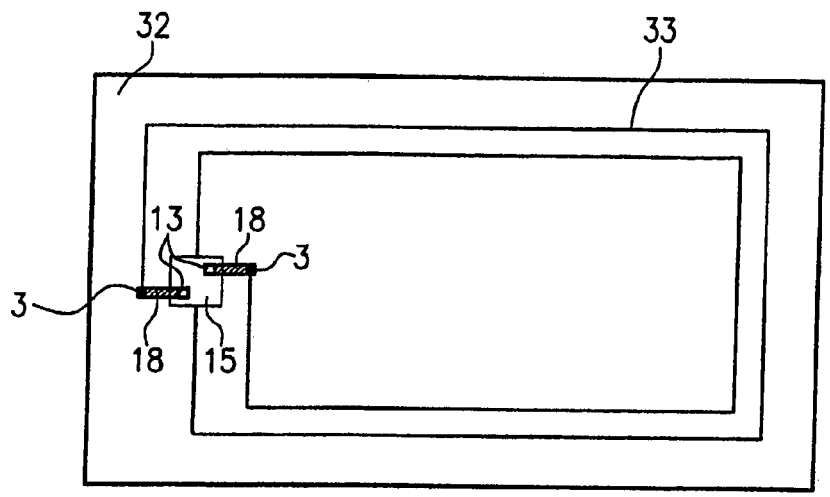
FIGS. 9 and 9a are schematic views of a contactless chip card with an antenna and a pre-contacted chip contact element unit.
Figure 9A:
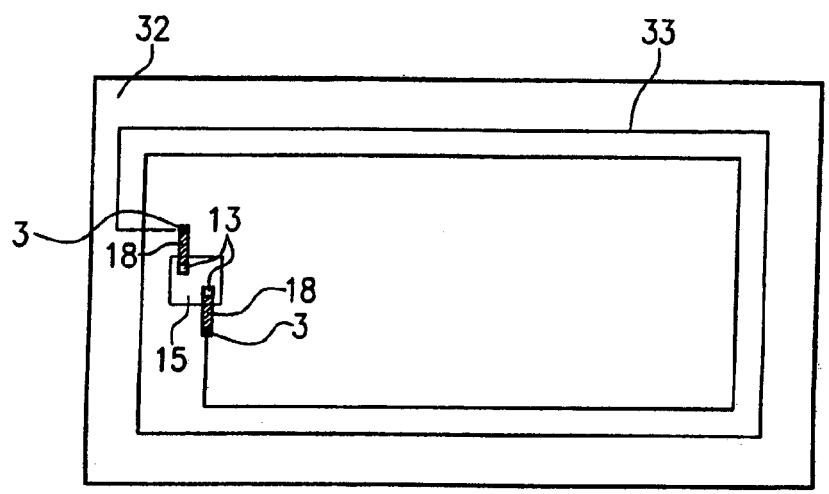

A direct processing of the individual chip contact element units may, after the individualization of the units, also take place directly, in other words, without the prior application thereof on a carrier substrate. In this case the units can be removed directly from the grouping predefined by the wafer, and, as is indicated in FIGS. 9 and 9a, can be connected with the contact terminals of the antenna coil 33 in an electrically conductive fashion.

Figure 9B:
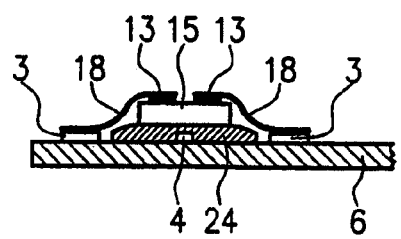
FIG. 9b is a schematic lateral view of a pre-contacted chip contact element unit.

According to FIG. 9b the chip contact element unit can be connected with the chip card body 6, preferably by means of gluing 24, whereby, for example, a radiation-hardenable glue, preferably an acrylate or epoxy glue activating polymerization by ultraviolet light of a predetermined wavelength, can be used. Since the chip 15 is thereby firmly connected with the chip card body 6, it will be described in the following explanations how, if the chip card body is extended or bent, a mechanical overload and possible damage of the chip 15 or, respectively, the contact elements can be avoided.

As a protection against overload a strain relief of the chip 15 may be achieved either by using a extensible glue for gluing the chip 15 onto the chip card body 6, by constructing the chip card body 6 underneath chip 15 to be extensible itself, or by weakening or reinforcing the chip area, which will be described in the following.

Figure 9C:
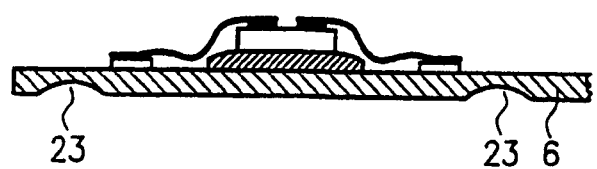
FIG. 9c shows schematic lateral views of a pre-contacted chip contact element connected with the chip card body, with a strain-relieved chip area.
Figure 9C:
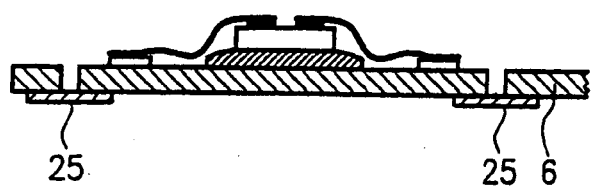
Figure 9C:
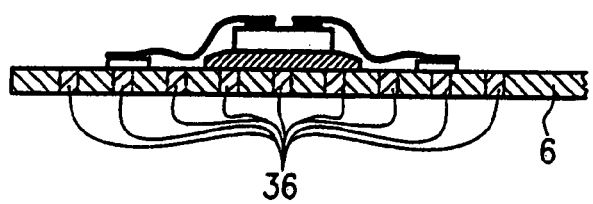
Figure 9C:
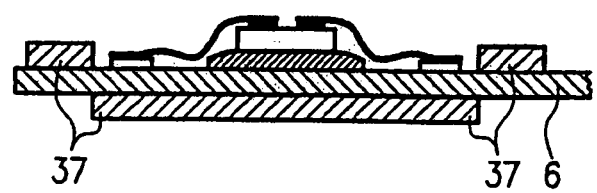

FIG. 9c shows schematic lateral views of a pre-contacted chip contact element unit connected with the chip card body 6, with four exemplarily indicated possibilities a)-d) for relieving the strain from the chip area. Possibility a) shows a chip card body 6 being thinner in the vicinity of the chip area so as to provide target bending points 23, which, if the chip card body 6 extends or bends, can bring about a strain relief for the chip 15. The thinning of the chip card body 6 in the illustrated areas 23 may be substituted with the application of another material 25, which is more extensible than the chip card body 6, and which is illustrated in possibility b). If it is not desired to thin the chip card body 6 around the chip area or to apply another material, the strain relief of the chip can be achieved by means of a perforation 36 arranged around the chip area, which is indicated in possibility c).

In another modification, illustrated by possibility d), the vicinity of the chip area is not weakened, but reinforced by applying an additional material 37, whereby it can be achieved that the area around the chip 15 becomes less extensible than the rest of the chip card body 6, so that, again, a strain relief of the chip 15 can be obtained.

It was indicated in the above-described four possibilities a) to d) for relieving the strain from a chip 15 connected with the chip card body 6 how, in addition to the strain relief of chip 15, a strain relief of the contact elements 18 can be effected. Said strain relief of the contact elements 18 is achieved in that the contact elements 18 are constructed to be longer than the distance between the contact terminals 3 and the bond pads 13 of the chip 15, so that the contact elements 18 can be brought to adopt an undulated shape during the contacting.

The undulation of the contact elements 18 may also be used for the strain relief of the contact elements 18, if the chip 15 is not, like in the above-described cases, connected with the chip card body 6. A strain relief of the chip 15 can particularly also be obtained in this case, which will be described in the following.

Figure 9D:
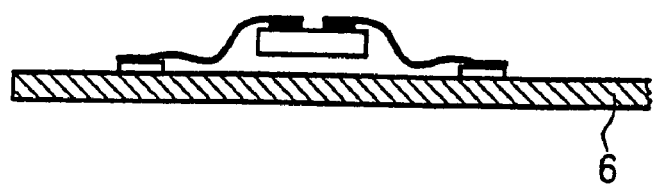
FIG. 9d shows schematic lateral vies of a pre-contacted chip contact element unit with a strain-relieved chip area.
Figure 9D:
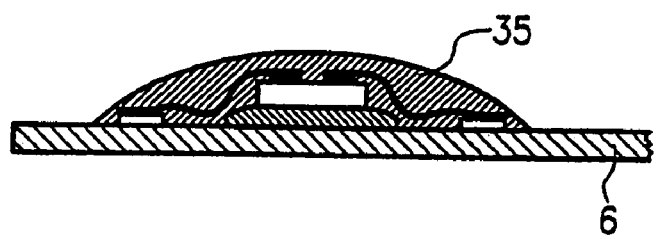
Figure 9D:
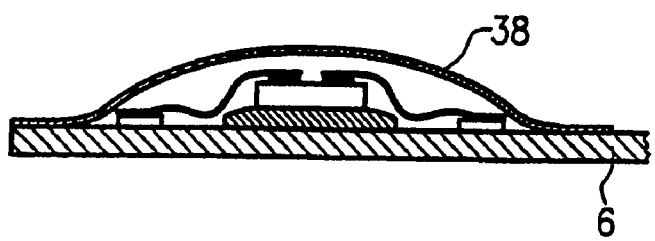

FIG. 9d shows schematic lateral views of a pre-contacted chip contact element unit not connected with the chip card body 6 and whereof the chip area is strain-relieved, which is illustrated in the three exemplarily indicated possibilities a)-c). In possibility c) the chip 15 is not connected with the chip card body 6, so that the chip 15 is not stressed even if the chip card body 6 is bent or extended, as only the chip card body 6, however, not the chip 15 can be extended or bent. The so obtained strain relief of the chip 15 can also be achieved if the chip 15 is sealed with a cover mass 35, which is illustrated in possibility b). In order to achieve that in this case, too, the chip 15 is not stressed when the chip card body 6 is extended or bent, the cover mass 35 is selected such that it is more extensible than the chip card body 6. According to another modification, shown in possibility c), the chip 15 can also be covered with a cover foil 38, whereby a sticky or adhesive connection of the cover foil 38 with the chip contact element unit should be avoided so as to secure the strain relief of the chip 15.

The invention claimed is:

1. A method of producing electrical units comprising chips with contact elements wherein the contact elements are suited for direct connection with contact terminals of external electric components in an electrically conductive fashion, comprising:

each chip has an active surface with at least one bond pad and a non-active surface arranged opposite the active surface, and the connection of the contact elements with at least one bond pad of the chips is effected before the individual chips are removed from a grouping predefined on a wafer and comprising of rows and columns wherein the contact elements are made of a flexible foil to be applied onto the chips, and each contact element is constructed such that it has a form and length permitting the contact element after the removal of a corresponding electrical unit from the grouping to reach the plane which coincides with the non-active surface of the chip, the length of each contact element being approximately a length of the flexible foil between bond pads on adjacent chips in the grouping.

2. The method of claim 1, characterized in that the predefined grouping is defined by sawing the wafer into rows and columns.

3. The method of claim 1, characterized in that the grouping is applied onto an adhesive holding foil in a holding frame.

4. The method of claim 1, characterized in that the grouping is applied onto a holding substrate.

5. The method of claim 1, characterized in that the foil to be applied onto the chips is structured so as to predefine the form of the contact elements.

6. The method of claim 1, characterized in that the foil to be applied onto the chips comprises gold.

7. The method of claim 1, characterized in that the foil to be applied onto the chips at least has the width of a bond pad.

8. The method of claim 1 characterized in that the connection of the foil with the individual chips is effected on at least two bond pads of each individual chip.

9. The method of claim 8, characterized in that the connection of the foil with the individual chips is effected on two bond pads of each individual chip and the two bond pads are each arranged at the same distance to one side of the respective chip so that the bond pads of the chip of one row together form a contact row.

10. The method of claim 9, characterized in that the rows are spaced apart from each other prior to the application of the foil such that the distance between bond pads of adjacent rows corresponds to the intended length of the contact elements.

11. The method of claim 9, further comprising:
placing the foil onto the wafer;
connecting the foil with all bond pads; and
cutting the foil.

12. The method of claim 9, further comprising:
connecting the foil with a first bond pad;
unrolling the foil in correspondence with the intended length of a contact element between the first bond pad and a second pond pad in an adjacent row;
connecting the foil with the second bond pad; and
cutting the foil at a location next to the second bond pad to form the contact element connected to the first bond pad.

13. The method of claim 12, characterized in that the cutting of the foil is effected after the complete connection of the foil.

14. The method of claim 12, characterized in that the connection of the chips with the foil is performed with a soldering, bonding or gluing process.

15. The method of claim 12, characterized in that the cutting of the foil is effected by means of a laser.

16. The method of claim 8, characterized in that the connection of the foil with the individual chips is effected on two bond pads of each individual chip and the two bond pads are each arranged at different distances to one side of the respective chip, wherein the two bond pads of the respective chip are arranged in a diagonally offset manner so that the bond pads of the chips of one row form two contact rows.

17. The method of claim 16, characterized in that the width of the bond pads corresponds approximately to the width of the foil and that the two bond pads of the respective chip are arranged at opposite sides of the respective chip.

18. The method of claim 8, characterized in that the connection of the contact elements with the individual chips is effected on four bond pads of each individual chip, wherein the bond pads are each located in the corners of the respective chip so that the bond pads of all chips of one row form two contact rows.

19. The method of claim 1 wherein the electrical units are applied onto carrier substrates for accommodation after the removal of the predefined grouping such that all chips of the wafer are received by the same carrier substrate.

20. The method of claim 19, characterized in that the contact elements of the chips stand perpendicularly to the carrier substrates.

21. The method of claim 19, characterized in that a set of non-separated contact elements of individual columns form carrier substrates.

22. The method of claim 1 wherein the foil comprises a flexible metallized plastic foil.

23. The method of claim 1 wherein the foil comprises a flexible metallic foil.

24. The method of claim 1 wherein each chip has a second bond pad on the active surface and the method further comprises:
applying a second flexible foil to the chips to form respective contact elements for the second bond pads of the chips.

25. The method of claim 24 wherein the chips are arranged in a column of three or more chips.

26. A method of producing contactless chip cards for producing an electrical connection between bond pads of respective chips and contact terminals of respective antenna:
producing chip contact element units by connecting contact elements with the bond pads of the respective chips prior to removing the individual chips from a grouping predefined by the wafer, wherein the contact elements are made from a flexible foil by cutting the flexible foil at a location next to the bond pad of an adjacent second chip such that the cutting forms the contact element with a length approximately equal to the length between the bond pad of the first chip and the bond pad of the adjacent second chip;
individualizing the corresponding chip contact element units;
gripping the individual chip contact element units and placing the respective unit onto a substrate having an antenna structure; and
connecting the chip contact element units with the contact terminals of the antenna.

27. The method of claim 26, characterized in that the following steps are performed between the individualizing of the corresponding chip contact element units and the gripping and placing thereof:
applying the chip contact element units onto a carrier substrate; and
inserting the carrier substrate into a processing unit.

28. The method of claim 26, characterized in that the respective chip is not connected with the substrate having an antenna structure.

29. The method of claim 28, characterized in that the chip contact element unit is sealed with a cover mass which is more extensible than the substrate having the antenna structure.

30. The method of claim 28, characterized in that the chip contact element unit is covered with a cover foil which does not entail an adhesive connection with the chip contact element unit.

31. The method of claim 26, characterized in that the respective chip is connected with the substrate having the antenna structure.

32. The method of claim 31, characterized in that the substrate is thinned in the vicinity of the respective chip.

33. The method of claim 31, characterized in that the substrate is supplied with a material in the vicinity of the respective chip which is more extensible than the substrate.

34. The method of claim 31, characterized in that the substrate is perforated in the vicinity of the respective chip.

35. The method of claim 31, characterized in that a material is applied in the vicinity of the respective chip onto the chip card body which is not more extensible than the substrate.

36. The method of claim 26 wherein the foil comprises a flexible metallized plastic foil.

37. The method of claim 26 wherein the foil comprises a flexible metallic foil.

38. The method of claim 26 wherein each chip in the grouping comprises a first and a second bond pad, the flexible foil is a first flexible foil, the method further comprising applying a second flexible foil to the second bond pads of the chips.

39. A method of producing chips having contact elements, the method comprising:
- forming a first plurality of three or more chips on a wafer, each chip having a first bond pad and a second bond pad;
- applying a first flexible foil comprising metal to the first bond pads of the first plurality of chips on the wafer, the first flexible foil forming respective contact elements for the first bond pads of the chips in the first plurality of chips;
- applying, parallel to the first flexible foil, a second flexible foil comprising metal to the second bond pads of the first plurality of chips on the wafer, the second flexible foil forming respective contact elements for the second bond pads of the chips in the first plurality of chips;
- cutting the first and second flexible foils to separate the first plurality of chips; and
- subsequently removing the first plurality of chips from the wafer.

40. The method of claim 39, further comprising:
- forming a second plurality of chips on the wafer, each chip in the second plurality of chips having a bond pad;
- applying a third flexible foil, parallel to the first and second flexible foils and comprising metal, to the bond pads of the second plurality of chips on the wafer; and
- subsequently removing the second plurality of chips from the wafer.

41. The method of claim 39, further comprising:
- forming a second plurality of chips on the wafer, each chip in the second plurality of chips having a bond pad;
- applying the first flexible foil comprising metal to the bond pads of the second plurality of chips on the wafer; and
- subsequently removing the second plurality of chips from the wafer.

42. The method of claim 39 wherein the first flexible foil comprises a flexible metallized plastic foil.

43. The method of claim 39 wherein the first flexible foil comprises a flexible metallic foil.

44. The method of claim 39 wherein forming the first plurality of chips comprises forming a column of chips on the wafer and the first flexible foil functions as a carrier substrate for the column of chips.

45. The method of claim 39, further comprising:
- coupling a chip in the first plurality of chips to an antenna by coupling the contact elements of the chip in the first plurality of chips to an electrical connector of the antenna.

46. The method of claim 39 wherein applying the first flexible foil comprising metal to the first bond pads of the first plurality of chips on the wafer comprises soldering the first flexible foil to the first bond pads of the first plurality of chips on the wafer.

47. A method of producing electrical units, comprising:
- forming a plurality of at least three chips aligned in a column on a wafer portion, each of the plurality of chips having at least two bond pads;
- affixing a plurality of pre-structured contact elements to a plastic foil material, the pre-structured contact elements having a length approximately equal to a length between a first bond pad of a first chip in the plurality of chips and a first bond pad of an adjacent chip in the plurality chips;
- affixing a second plurality of pre-structured contact elements to the plastic foil material, the second plurality of pre-structured contact elements having a length approximately equal to a length between a second bond pad of the first chip in the plurality of chips and a second bond pad of the adjacent chip in the plurality chips; and
- bonding a portion of the pre-structured contact elements to the respective bond pads of the chips in the column to connect the pre-structured contact elements with the respective bond pads of the chips.

48. The method of claim 47, further comprising:
- removing the electrical unit from a grouping predefined on the wafer portion after the pre-structured contact elements are bonded to the respective bond pads.

49. The method of claim 47 wherein each contact element is constructed such that it has a form and length permitting the contact element after the removal of a corresponding electrical unit from a grouping to reach a plane coinciding with a non-active surface of the chip.

50. The method of claim 47, further comprising:
- removing the plastic foil material thereby leaving the pre-structured contact elements bonded with the respective bond pads.

* * * * *